United States Patent [19]
Taylor

[11] Patent Number: 6,031,773
[45] Date of Patent: Feb. 29, 2000

[54] METHOD FOR STRESS TESTING THE MEMORY CELL OXIDE OF A DRAM CAPACITOR

[75] Inventor: Ronald Thomas Taylor, Grapevine, Tex.

[73] Assignee: STMicroelectronics, Inc., Carrollton, Tex.

[21] Appl. No.: 09/215,855

[22] Filed: Dec. 18, 1998

[51] Int. Cl.[7] .................................................. G11C 29/00
[52] U.S. Cl. ............................................ 365/201; 365/149
[58] Field of Search ....................................... 365/201, 149

[56] References Cited

U.S. PATENT DOCUMENTS 5,798,649  8/1998  Smayling et al. ...................... 324/551

*Primary Examiner*—Andrew Q. Tran
*Attorney, Agent, or Firm*—Theodore E. Galanthay; Lisa K. Jorgenson; Peter J. Thoma

[57] ABSTRACT

A method of stress testing a DRAM such that higher voltages of up to the supply voltage VDD may be applied to the oxide of memory cell capacitors. The DRAM is driven into a stress test mode when the sense amplifiers have been isolated, the precharge voltage and the half bitlines have been grounded, and the word line boost circuitry has been disabled or set to operate at a lower voltage level. These conditions allow the memory cell capacitors, isolated from the sense amplifiers and the word line boost circuitry, to be stress tested independently at a lower power supply and word line voltage levels than are used to stress test conventional DRAMs. The memory cell oxide stresses are applied at room temperature, in wafer form, in seconds instead of hours, and before the configuration of redundancy elements. The inventive method permits the critical burn-in VDD value to be chosen so as to optimize burn-in of the memory cell capacitors and peripheral CMOS circuitry.

16 Claims, 2 Drawing Sheets

METHOD FOR STRESS TESTING THE MEMORY CELL OXIDE OF A DRAM CAPACITOR

CROSS-REFERENCE TO OTHER APPLICATIONS

This application is related to an application for patent entitled "Self Boosted Wordline", U.S. application Ser. No. 09/215,854, filed on the same date as this application, which is assigned to the assignee hereof and is incorporated herein by reference.

BACKGROUND OF THE INVENTION

This invention is directed to testing memory cell oxides and more particularly to stress testing a memory cell oxide of a dynamic random access memory device otherwise known as a DRAM.

FIG. 1 shows a critical bitline and wordline (X) decoder circuitry of a prior art folded bitline DRAM 10 with an N channel X decoder 20.

In DRAM 10 of FIG. 1, memory blocks 40a, 40b, 40c, and 40d each have two memory cells (i.e., access MOSFETS mc 42a, a'; 42b, b'; 42c, c', and 42d, d', respectively). Each memory cell 42a, a'–d, d' has one capacitor 44a, a'–d, d', respectively. Access MOSFETs mc (42a, a'–d–d') are arranged in a linear sequence (hereinafter called the X direction) to form two bitlines 16a, b of a multi-bitline DRAM 10. If the memory cells are grouped into pairs where alternating wordlines wl0 (No. 18a in FIG. 1), wl2, . . . , wln−2 (18c) connect memory cells 40a–d to a bitline wire 110 designated bt in FIG. 1, and alternating wordlines wl1 (18b), wl3, . . . , wln−1 (18d) connect memory cells to a bitline wire 112 adjacent to bt and designated as bc in FIG. 1, then bitline wires bt (110) and bc (112) are said to be half bitlines. This adjacency of half bitlines is called a folded bitline architecture and is the preferred arrangement of memory cells in DRAMs in commercial production today. Completing the two bitlines 16a, 16b are precharge devices 30a, b comprising MOSFETs mpt (32a, b), mpc (34a, b) and mp (36a, b), respectively; isolation devices 50a, b comprising isolation MOSFETs mit (52a, b) and mic (54a, b), respectively, which could in some applications be N channel depletion MOSFETs, P channel MOSFETs or even CMOS transmission gates; a sense amplifier 60a, b; and finally; bitline access (Y Select) device 70a, b comprising MOSFETs which could in some applications be CMOS transmission gates or, even P channel MOSFETs.

In DRAM 10, memory cells 40a–d store the data. In order for there to be efficient utilization of silicon area in a memory device, it is advantageous to have as many of these memory cells as possible in each bitline 16a, b. For n memory cells connected to a single bitline, each memory cell is connected to a unique wordline so as to generate a sequence of wordlines designated wl0 (No. 18a in FIG. 1), wl1 (No. 18b in FIG. 1), wl2, . . . , wln−2 (No. 18c in FIG. 1), wln−1 (No. 18d in FIG. 1). Multiple bitlines placed adjacent to one another form a rectangular array of m bitlines designated bitline0 (No. 16a in FIG. 1), bitline1 (not shown), . . . , bitlinem−1 (16b) and connected together by n wordlines and a few control signals such as pblt (taken off pblt node 122), sense (taken off node 129), etc. In a modern DRAM, for each array, typically the number of wordlines n=255, and the number of bitlines is m=1023. The DRAM will have a number of such arrays. For any DRAM, the practical upper limits for n, m, and the number of arrays are then constrained by having a large enough signal to be read by the sense amplifier (constraint on n) and by active power consumption (constraint on m and the number of arrays).

The operation of DRAM 20 shown in FIG. 1 is best explained by reference to FIG. 2 which shows idealized waveforms for DRAM 10. While dummy cells are used on most (but not all) DRAMs to supply a fixed offset to sense amplifier 60a, b, the dummy cells have been omitted here to simplify the figures and discussion. It will be appreciated that the invention may be used on DRAMs with or without dummy cells.

Initially, DRAM array 10 is in the inactive precharge state shown at the left edge of the FIG. 2 waveforms. As shown in FIG. 2, wordlines wl0 (No. 18a in FIG. 1) through wln−2 (No. 18c in FIG. 1) and Y select (Nos. 70a, b in FIG. 1) signals YS0 through Ysm−1 are in their low (GND) state rendering all memory cell access MOSFETS (Nos. 42a, a'–d, d' in FIG. 1) and Y select MOSFETs (Nos. 72a, b and 74a, b in FIG. 1) nonconductive. In FIG. 2, control signals iso (on iso node No. 124, in FIG. 1) and pblt (on pblt node 122) are at VDD. Since signal pblt (on pblt node No. 122 in FIG. 1) is at VDD, all precharge MOSFETS (Nos. 30a, b in FIG. 1) are in their conductive state precharging all half bitlines bt and bc (Nos. 110 and 112, respectively in FIG. 1) to voltage level vbeq (on vbeq node No. 126 in FIG. 1) whose value is approximately VDD/2 as shown in FIG. 2. Additionally shown in FIG. 2, since the iso signal (on iso node No. 124 in FIG. 1) is at VDD all isolation MOSFETs (Nos. 50a, b in FIG. 1) are in their conductive state precharging sense amplifier (Nos. 60a, b in FIG. 1) nodes t and c (Nos. 62a, 64a of sense amplifier 60a, for example, in FIG. 1) to bitline halves bt and bc respectively (Nos. 110, 112 in FIG. 1) and hence to VDD/2. The sense and restore lines 128, 129 of FIG. 1 are separately precharged to VDD/2 by peripheral circuitry not shown in FIG. 1 and hence all sense amplifier MOSFETs are in a nonconductive state.

Information is read from DRAM 10 through a sequence of operations shown in FIG. 2 beginning on the left hand side of the figure. As shown in FIG. 2, signal pblt (on pblt node No. 122 in FIG. 1) switches to the GND state isolating the bitlines of the selected array and their associated sense amplifier nodes t and c (Nos. 62a,c, for example) from precharge signal vbeq (on vbeq node No. 126 in FIG. 1). One of the n wordline decoders (No. 22 in FIG. 1, for example) is enabled to prepare to connect a memory cell to each bitline in the selected array. This is done by supplying an address on the X decoder address bus which is the output from n channel x decoder 20. Through appropriate logical operations, this causes the selected X decoder 22 node a (No. 22a in FIG. 1) to switch to VDD and its node c (No. 22c in FIG. 1) to switch to GND, the latter transition disconnecting the to be activated wordline (wl0 in FIG. 2) (wl0 is shown as 18a in FIG. 1) from the GND node. As node a (Nos. 22a in FIG. 1) rises to VDD, node d (No. 22d in FIG. 1) rises from an intermediate level (shown as VDD-Vtn in FIG. 2) to a voltage that is greater than VDD by at least one N channel threshold voltage (Vtn), thus allowing node b (No. 22b in FIG. 1) to be precharged to VDD. Node d (No. 22d in FIG. 1) is then discharged to VDD or to VDD-Vtn as shown in FIG. 2 rendering MOSFET ma (Nos. 22e in FIG. 1) nonconductive and isolating node b (No. 22b in FIG. 1) at a voltage level of VDD. As there are a number of circuit techniques available to do this in common use in DRAMs a detailed explanation will not be given here.

The memory cell read operation is now initiated by the transition of wordline clock rclk (taken from line No. 29 in FIG. 1) from GND to a boosted or bootstrapped level that is at least Vtn above VDD. Since MOSFET mb (22g in FIG.

1) is in the conductive state wordline Wl0 (No. 18a in FIG. 1) follows rclk taken from rclk node (No. 29 in FIG. 1) from GND to the boosted level. As the rclk signal (on rclk line No. 29 in FIG. 1) and the wl0 signal (on wl0 line No. 18a in FIG. 1) rise, the channel capacitance of MOSFET mb (No. 22g in FIG. 1) increases the voltage of node b (No. 22b in FIG. 1) thus maintaining it in the conductive state. Thus wordline wl0 (No. 18a in FIG. 1) can be fully charged to the final boosted level of rclk (taken from rclk line No. 29 in FIG. 1).

The rise of wordline wl0 (No. 18a in FIG. 1) makes conductive the appropriate memory cell access MOSFETs (mc) (No. 42a, b in FIG. 1) allowing the selected memory cells to discharge to (or be charged from) their respective half bitlines. In FIG. 2, wordline wl0 (No. 18a in FIG. 1) is shown discharging a memory cell to half bitline bt (No. 110 in FIG. 1) thus imparting a slightly greater voltage on half bitline bt relative to bitline bc (No. 112 in FIG. 1) which is not connected to a memory cell. The resulting small voltage difference between half bitlines bt and bc is then propagated through isolation MOSFETs mit (Nos. 52a, b in FIG. 1, respectively) and mic (Nos. 54a, b in FIG. 10) onto sense amplifier nodes t and c (Nos. 62a and 64a in FIG. 1, respectively). This small voltage signal can be amplified by the sense amplifier by switching the sense signal (from sense node 129 in FIG. 1) to GND and the restore signal (from restore node 128 in FIG. 1) to VDD. As the operation of the sense amplifier has been described in detail elsewhere and is common to all DRAMs it will not be described in detail here. The final sense amplifier voltages of node c (64a, b in FIG. 1) at GND and node t (node 62a, b in FIG. 1) at VDD are then propagated back through the isolation MOSFETs onto half bitlines bt and bc (Nos. 110 and 112 in FIG. 1, respectively). In the case of DRAM 10 in FIG. 1, the isolation MOSFETs (Nos. 50a, b in FIG. 1) are N channel MOSFETs and the iso signal (taken from its node No. 124 in FIG. 1) must be boosted to a voltage level at least one Vtn above VDD as shown in FIG. 2 to allow half bitline bt to rise to VDD. Finally, after the sense amplifier (Nos. 60a,b in FIG. 1) has been latched, designated Y select MOSFETs (Nos. 72a, 74a in FIG. 1) may be enabled to read the sense amplifier data to peripheral circuits or to allow new data to be written onto the sense amplifier and bitline nodes.

The DRAM memory array is returned to its inactive state by discharging the wordline wl0 to GND thus isolating the memory cells, returning the appropriate Y select signals to their inactive (GND) state and, then activating the precharge MOSFETs to precharge the bitline and sense amplifier nodes. After a suitable precharge time another cycle may begin.

In order to economically increase the data storage capacity of DRAMs, the physical sizes of the components used to manufacture them has steadily decreased, driven by advances in process technology. The dielectric thicknesses of the oxide layers in the MOSFETs and capacitors used to fabricate modern DRAMs, for example, are now less than 100 angstroms, and, the voltages applied to these MOSFETs generate electric fields that may cause permanent stress damage to the MOSFET gate and memory cell capacitor oxides (Nos. 44a, a'–d, d' in FIG. 1). Wordline access MOSFET mc (Nos. 42a, a'–d, d' in FIG. 1) and isolation MOSFETs mit and mic (Nos. 52a,b, 54a,b in FIG. 1) of DRAM 10 in FIG. 1 are particularly vulnerable because wordlines and the iso signal (taken from node 124 in FIG. 1) are driven to extraordinarily high boosted voltages while node bt or bc (Nos. 110, 112 in FIG. 1, respectively) is driven to GND.

In order to guarantee the long term reliability of semiconductor components including DRAMs these products are prestressed by operating the products for a brief period of time (usually 24 hours) at voltages and temperatures in excess of those permitted in normal operation. The object of the applied stress is to induce the failure of units that may have microscopic production defects while in this so called "burn in" environment. Failed units can be discarded prior to shipment to the end use customer. The effects of a given voltage and/or temperature overstress for a given unit of time are very well understood in the semiconductor industry. It is thus possible to use these overstress techniques to accurately predict failure rates of most semiconductor components including DRAMs.

Performing burn in on DRAMs, however, is substantially more difficult than for general CMOS logic circuits such as NAND gates, INVERTERs, etc. In part, this is because MOSFET mc (Nos. 42a, a–d, d' in FIG. 1), and isolation MOSFETs mit and mic (Nos. 52a,b, 54a,b in FIG. 1) are already driven to abnormally high voltages while other nodes, such as the memory cell reference node vplate 130, is driven to an abnormally low voltage. The oxide of the memory cell capacitors cc (Nos. 44a, a'–dd, d') in FIG. 1) also has its own specific burn in requirements. These requirements have become increasingly difficult to perform without the application of damaging overvoltages to wordline and isolation circuitry of the DRAM and, possibly even to general purpose CMOS logic circuits peripheral to the DRAM.

SUMMARY OF INVENTION

The invention disclosed here provides a method for changing the operation of a conventional DRAM for purposes of stress testing the DRAM in a way that allows lower voltages to be applied to the oxide of memory cell capacitors in each memory cell during stress testing. In accordance with the inventive method, stress testing occurs under conditions such that each sense amplifier of the DRAM has been isolated, each precharge voltage and half bitlines have been grounded, and each wordline boost circuitry has been disabled or set to operate at a lower voltage level so as to keep the voltage levels on the wordline below the supervoltage levels reached in conventional DRAMs. These conditions allow memory cell capacitors of the memory cells to be essentially isolated from sense amplifier, and the wordline boost circuitry to be disabled, thus allowing memory cell capacitors to be stress tested independently at lower wordline and VDD voltage levels than are used to stress test conventional DRAMs. The inventive method allows the memory cell oxide stresses to be applied at room temperature, in wafer form, in seconds instead of hours and, before the configuration of redundance elements, if any. The inventive method removes all memory cell oxide burn in constraints created by sense amplifier, precharge voltage, half bitlines and wordline boost circuitry; thus allowing the critical burn in VDD value to be chosen so as to optimize burn in of the memory cell capacitors and peripheral CMOS circuitry. Stress tests can be performed simultaneously on all of the DRAM's memory cells and the results can be continuously monitored to identify defect locations and types, identify physical failure modes such as shorts between nodes and, gather redundancy configuration information.

The method is particularly effective in stress testing a memory cell oxide of a folded bit DRAM comprising: memory cells each memory cell having a memory cell reference node vplate, said memory cells being arranged in a linear sequence to form bitlines and grouped into pairs where a first set of alternating wordlines connect memory cells to a half bitline bt and a second set of alternating wordlines connect memory cells to a half bitline bc; a precharge device having a precharge voltage node vbeq; an isolation device having an iso node, a sense amplifier; a bitline access node pblt; an X decoder device; a wordline clock node rclk; and a (Y select) device for generating YS enable/disable signals.

In the preferred method, stress testing occurs by: (a) initializing all nodes connected to said memory cells to GND so that no bias current flows in said memory array by the steps of: (i) driving said DRAM into a memory cell oxide stress test mode; (ii) initializing the vbeq line to GND in said test mode; (iii) maintaining the pblt line in its active state connecting all half bitlines bt and bc to the vbeq line; (iv) isolating said sense amplifier from said bitlines by initializing all YS signals and an iso signal on the iso node to GND; and (v) driving vplate node to GND by test control circuitry; (b) disabling wordline boost circuitry so that rclk and said wordlines are only driven to VDD; (c) activating one or more wordlines; (d) driving vplate node to a predetermined stress test voltage greater than VDD/2 that has been calculated to short out any cell that will not meet a specified reliability criteria; (e) monitoring currents flowing into peripheral rclk, vbeq, and vplate driver circuits whereby the amount and type of leakage into each terminal indicate a likely failure mechanism.

BRIEF DESCRIPTION OF THE DRAWINGS

The aforementioned and other features, characteristics, advantages, and the invention in general, will be better understood from the following, more detailed description taken in conjunction with the accompanying drawings in which.

DESCRIPTION OF THE PREFERRED EMBODIMENT

Figure 1:
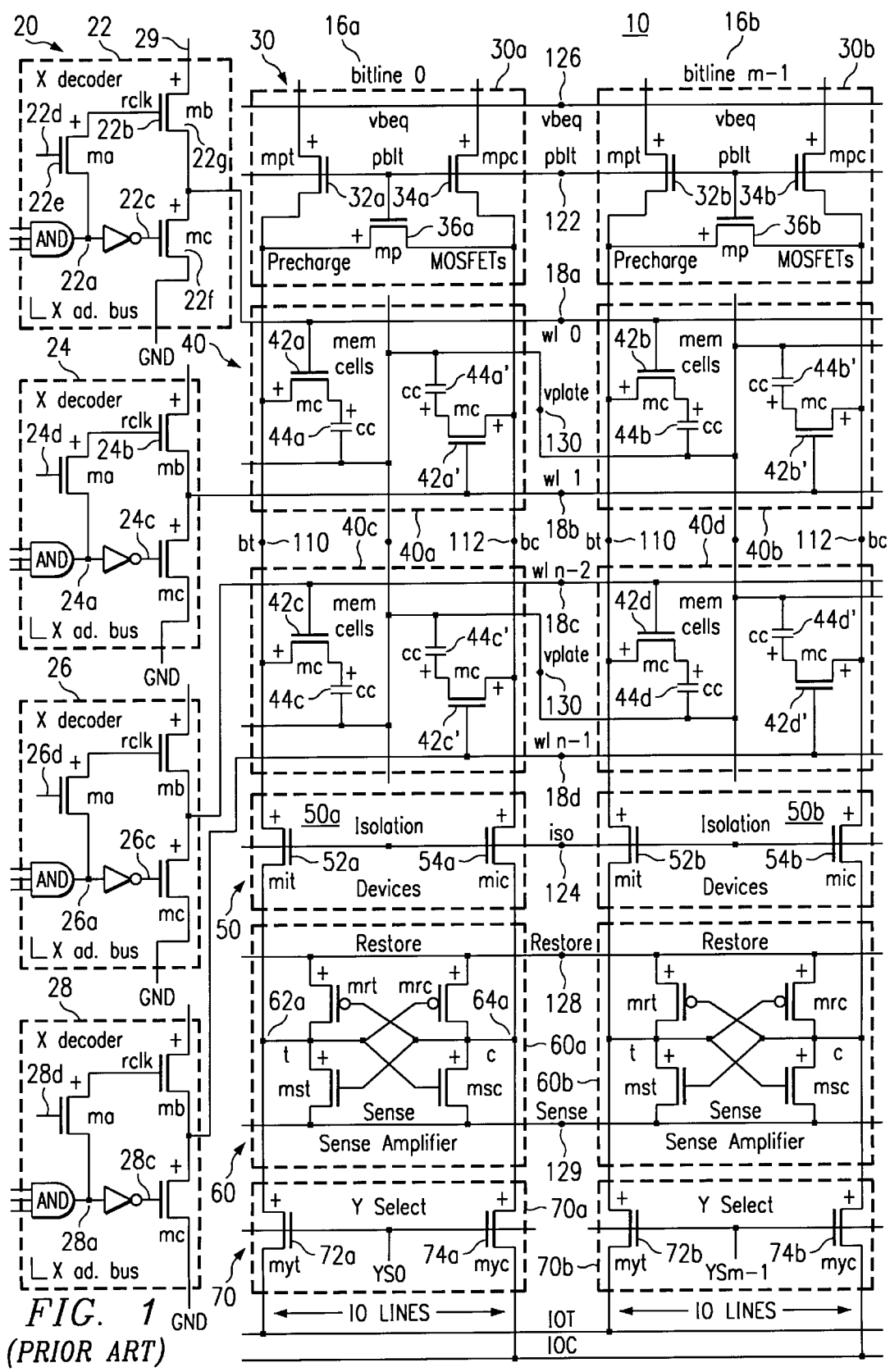
FIG. 1 is a schematic diagram of a prior art folded bitline DRAM 10 with N channel X Decoder 20 and VDD/2 precharge and cell plate.

This invention is a method for stress testing a memory cell oxide of a prior art folded bit DRAM 10 of the kind shown in FIG. 1 and described in the Background of the Invention Section above comprising (i): memory cells 40, each memory cell having a memory cell reference node vplate 130 and being arranged in a linear sequence to form bitlines 16a,b and further being grouped into pairs where a first set of alternating wordlines (18a,c) connect memory cells to a half bitline bt 110 and a second set of alternating wordlines (18b,d) connect memory cells to a half bitline bc 112; (ii) a precharge device 30 having a precharge voltage node vbeq 126; (iii) an isolation device 50 having an iso node 124; (iv) a sense amplifier 60; (v) a bitline precharge enable node pblt 122; (vi) an X decoder device 20; (vii) a wordline clock line rclk 29; and (viii) a (Y select) device 70 for generating YS enable/disable signals.

Referring to FIG. 1, the preferred method comprises the steps of: (a) initializing all nodes connected to memory cells 40 to GND so that no bias current flows in said memory array by the steps of: (i) driving said DRAM 10 into a memory cell oxide stress test mode; (ii) initializing the vbeq line 126 to GND in said test mode; (iii) maintaining the pblt line 122 in its active state so as to connect all half bitlines bt and bc 110, 112, respectively, to the vbeq line 126; (iv) isolating said sense amplifier 70 from said bitlines 16a,b by initializing all YS signals taken from signal (Y select) device 70 and an iso signal taken from iso node 124 to GND; and (v) driving vplate node 130 to GND by test control circuitry; (b) disabling a wordline boost circuitry 30 so that clock signal rclk taken from rclk line 29 and said wordlines are only driven to VDD; (c) activating one or more wordlines; (d) driving vplate node 130 to a predetermined stress test voltage greater than VDD/2 that has been calculated to short out any cell that will not meet a specified reliability criteria; and (e) monitoring currents flowing into peripheral line rclk 29, vbeq node 126, and vplate node 130 driver circuits whereby the amount and type of leakage into each terminal indicate a likely failure mechanism.

The operation of DRAM 10 with the invention is best explained by reference to FIG. 3. In this Figure, DRAM 10 has powered up in, or, has been commanded to enter the memory cell oxide stress test mode. As can be seen the pblt signal (taken from node No. 122 in FIG. 1) remains in its active state connecting all half bitlines bt and bc (Nos. 110, 112, in FIG. 1) to node vbeq (No. 126 in FIG. 1) which has been initialized to GND in the test mode. All YSelect signals (Nos. 70a,b in FIG. 1) and the iso signal (taken from node No. 124 in FIG. 1) are initialized to GND isolating sense amplifier (Nos. 50a, b in FIG. 1) from the bitlines. The wordlines are initially at GND as they would be in normal operation and, finally, the vplate node 130 has been initialized to GND by test control circuitry (not shown in FIG. 3). In this initial state all nodes connected to the memory cells are at GND and there are no bias voltages and hence no possible current flows in the memory arrays.

The second step in the test is to activate one or more wordlines. In the preferred embodiment shown in FIG. 3 all wordlines are activated simultaneously but the wordline boost circuitry (Nos. 30a,b in FIG. 1) is disabled so that clock node rclk (No. 29 in FIG. 1) and the wordlines are only driven to VDD. Alternatively, one or more wordlines can be activated simultaneously for the stress test. The oxide stress of the access MOSFETs mc (nos. 42a, a'–d, d') and all other MOSFETs in the cell oxide stress test mode is at most VDD and therefore similar to that of the peripheral CMOS circuitry. After the wordlines have been activated, useful IDDQ type test information can be obtained about wordline-to-bitline, wordline-to-plate and wordline-to-substrate leakages by monitoring the currents flowing into the peripheral rclk, vbeq and, vplate driver circuits. The circuitry to do this may be a part of the external tester provided that the vbeq and vplate nodes are connected to bond pads in the test mode or, it could be on chip operational amplifier based comparators controlled by a Built in Self Test (BIST) engine. The amount and type of leakage into each terminal indicates the likely failure mechanism. For example, equal currents flowing out of the rclk driver and into the vbeq driver is indicative of a wordline-to bitline leakage. If leakage currents are detected they can be localized by deselecting the wordlines to GND and then activating them one at a time. This information may be very useful for redundancy configuration, failure analysis and the collection of statistical process data.

There are a number of tests that can be run during this preliminary phase since it is possible to independently vary the voltages on vplate and vbeq from GND to VDD/2 while the wordlines are at GND or at VDD but these tests are not the primary thrust of the invention. For example bitlines 16a, b can be driven to VDD/2 while the wordline are at GND to search for bitline leakages, etc.

Figure 3:
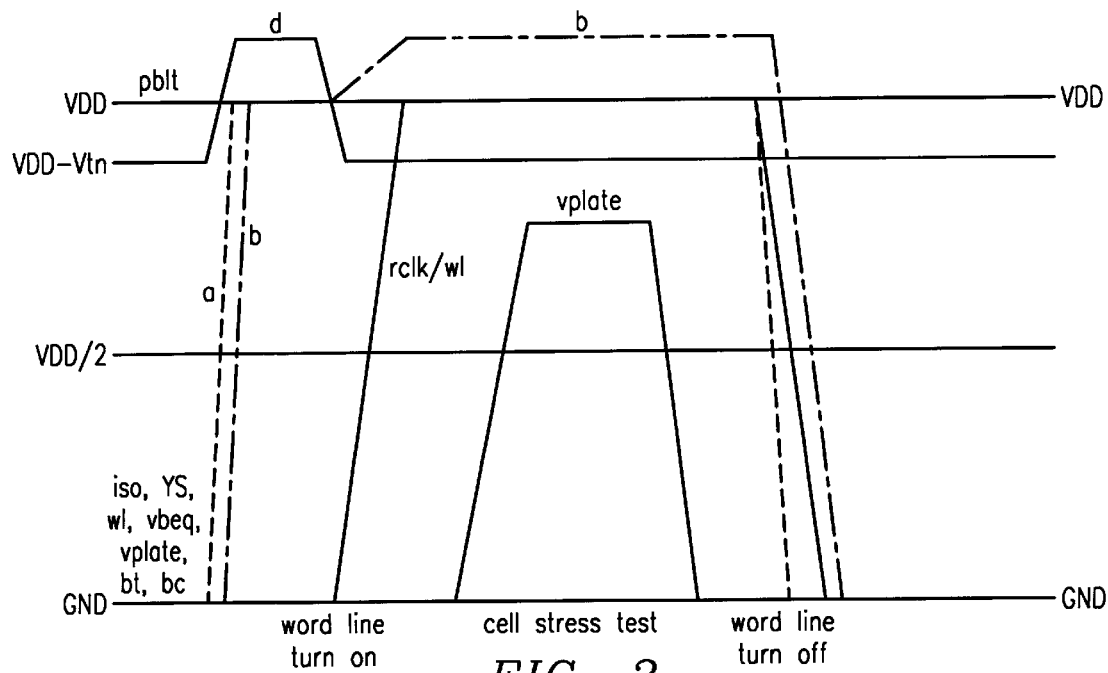
FIG. 3 is a timing diagram of certain signals in the folded bitline DRAM 10 with N channel X Decoder 20 of FIG. 1 when the DRAM is operating in a cell oxide stress test mode according to the method of this invention.

In the basic test mode, after the wordlines have reached VDD the vplate node 130 is driven to some predetermined stress test voltage as shown in FIG. 3. This voltage has been calculated to provide a memory cell oxide stress that will short out any cell that will not meet the specified reliability criteria. Obviously the applied voltage must be greater than VDD/2 but it may be less than VDD as shown in FIG. 3. The test can, however, provide a full VDD stress which would represent a 100% overvoltage relative to the normal operating modes. Since all memory cells are being stressed simultaneously, the total oxide surface area is very large and it should be possible given sufficiently thin memory cell oxides to actually measure the onset of a tunneling current through the memory cell oxide. This would provide processing information and possibly could be used as an automatic stress test end point detection method.

In the event that there are many defective memory cells in a DRAM 10 there may be a measurable current flowing out of the vplate driver, through the defective cell oxides and into the vbeq driver. If this current is large enough it may prevent vplate from reaching its target voltage and hence prevent the remaining good cells from being adequately stressed. In this case the test can be run one wordline at a time thus lowering the total driver currents and allowing identification of the wordlines containing the defective cells.

Figure 2:
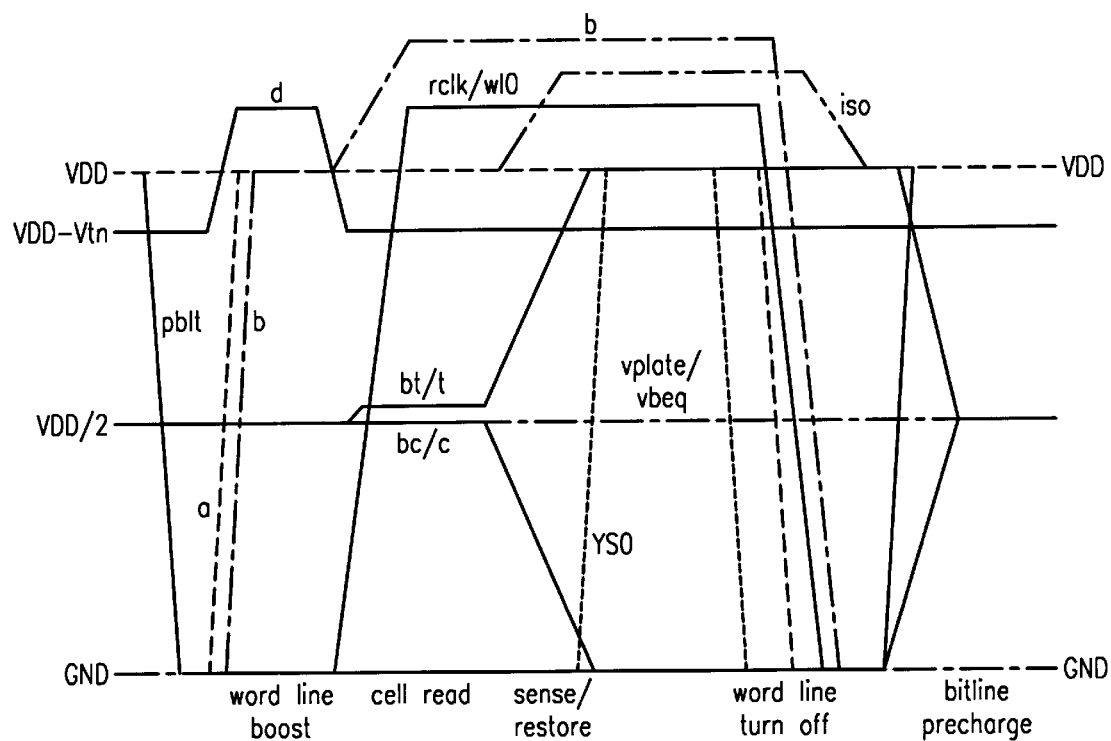
FIG. 2 is a timing diagram of certain signals in the folded bitline DRAM 10 with N channel X Decoder 20 of FIG. 1.

After stressing the memory cell oxides by applying an appropriate vplate voltage (taken from vplate node 130 in FIG. 1) for an appropriate time, DRAM 10 exits the stress test mode as shown in FIG. 3 and returns to the normal operating mode of FIG. 2. It can now be operated briefly at a VDD value specifically chosen to adequately stress the high voltage wordline circuitry. In the final production burn in the wordlines clock (rclk) (taken from rclk node 29 in FIG. 1) can actually be disabled allowing all DRAM wordlines (but not dummy wordlines) to remain at GND. This allows the final burn in environment (VDD, temperature, etc.) to be chosen solely for the optimum stressing of the CMOS periphery.

The invention disclosed here provides a method for changing the operation of a conventional DRAM for purposes of stress testing the DRAM in a way that voltages of up to VDD may be applied to the oxide of memory cell capacitors in each memory cell during stress testing. In accordance with the inventive method, stress testing occurs under conditions such that each sense amplifier of the DRAM has been isolated, each precharge voltage and half bitlines have been grounded, and each wordline boost circuitry has been disabled or set to operate at a lower voltage level so as to keep the voltage levels on the wordline below the supervoltage levels reached in conventional DRAMs. These conditions allow memory cell capacitors of the memory cells to be essentially isolated from sense amplifier thus allowing memory cell capacitors to be stress tested independently at lower wordline voltage levels than are used to stress test conventional DRAMs. The inventive method allows the memory cell oxide stresses to be applied at room temperature, in wafer form, in seconds instead of hours and, before the configuration of redundance elements, if any. The inventive method removes all memory cell oxide burn in constraints created by sense amplifier, precharge voltage, half bitlines and wordline boost circuitry; thus allowing the critical burn in VDD value to be chosen so as to optimize burn in of the peripheral CMOS circuitry. Stress tests can be performed simultaneously on all of the DRAM's memory cells and the results can be continuously monitored to identify defect locations and types, identify physical failure modes such as shorts between nodes and, gather redundancy configuration information.

While the invention has been described in terms of specific embodiments, it will be appreciated that variations and modifications may be made in the structure and mode of operation without departing from the spirit and scope of the invention as herein claimed.

What is claimed is:

1. A method for stress testing a memory cell oxide of a folded bitline DRAM array comprising memory cells each memory cell having a memory cell reference node vplate, said memory cells being arranged in a linear sequence to form bitlines and grouped into pairs where a first set of alternating wordlines connect memory cells to a half bitline bt and a second set of alternating wordlines connect memory cells to a half bitline bc; a precharge device having a precharge voltage node vbeq; an isolation device having an iso node, a sense amplifier; a bitline precharge enable node pblt; an X decoder device; a wordline clock node rclk; and a (Y select) device for generating YS enable/disable signals; the method comprising the steps of:

(a) initializing all nodes connected to said memory cells to a ground voltage (GND) so that no bias current flows in said memory array by the steps of: (i) driving said DRAM into a memory cell oxide stress test mode; (ii) initializing the vbeq line to GND in said test mode; (iii) maintaining the pblt line in its active state connecting all half bitlines bt and bc to the vbeq line; (iv) isolating said sense amplifier from said bitlines by initializing all YS signals and an iso signal on the iso node to GND; and (v) driving vplate node to GND by test control circuitry;

(b) disabling wordline boost circuitry so that rclk and said wordlines are only driven to a supply voltage (VDD);

(c) activating one or more wordlines; and (d) driving vplate node to a predetermined stress test voltage greater than VDD/2 that was calculated to short out any cell that will not meet a specified reliability criteria.

2. The method of claim 1 comprising the further step of monitoring currents flowing into the peripheral rclk, vbeq, and vplate driver circuits whereby the amount and type of leakage into each terminal indicate a likely failure mechanism.

3. The method of claim 2 wherein equal currents flowing out of the rclk driver circuit and into said vbeq driver circuit is indicative of a wordline-to bitline leakage.

4. The method of claim 2 wherein said vbeq and vplate nodes are connected to bond pads in said test mode and an external tester is used to monitor currents flowing into said vbeq and vplate driver circuits.

5. The method of claim 2 wherein if a large current flowing out of said vplate driver circuit through the defective cell oxides and into said vbeq driver circuit prevents the vplate node from reaching its target voltage and the remaining good cells from being adequately stressed, said test is run one wordline at a time thus lowering the total driver currents and allowing identification of the wordlines containing the defective cells.

6. The method of claim 1 wherein said stress test voltage is less than VDD.

7. The method of claim 1 wherein said stress test voltage is VDD so as to represent a 100% overvoltage relative to a normal operating mode of said DRAM.

8. The method of claim 1 comprising the further steps that if leakage currents are detected, said wordlines are deselected to GND and then activated one at a time in order to localize the wordline source of said leakage.

9. The method of claim 1 wherein information generated on leakage currents and location is used for redundancy configuration.

10. The method of claim 1 wherein information generated on leakage currents and location is used for failure analysis.

11. The method of claim 1 wherein information generated on leakage currents and location is used for statistical process data collection.

12. The method of claim 1 wherein said vbeq and vplate nodes are connected to an on chip operational amplifier based comparator controlled by a built in self test engine.

13. The method of claim 1 wherein the voltages on vplate and vbeq nodes are independently varied from GND to VDD/2 while said wordlines are at GND or at VDD to search for bitline leakages.

14. The method of claim 1 wherein all memory cells are stressed simultaneously so as to generate information pertaining to the onset of tunneling current through memory cell oxide of said memory cells.

15. The method of claim 1 further comprising the step of said DRAM exiting the stress mode and returning to the normal mode of operation after an appropriate vplate voltage is applied to the memory cell oxides for an appropriate period of time.

16. The method of claim 1 further comprising the step of disabling said wordline clock rclk to allow all DRAM wordlines, but not dummy wordlines, to remain at GND and a further burn in test is performed to stress the CMOS periphery.

* * * * *